United States Patent
Vikash et al.

(10) Patent No.: US 9,047,936 B2
(45) Date of Patent: Jun. 2, 2015

(54) MEMORY DEVICE HAVING CONTROL CIRCUITRY FOR WRITE TRACKING USING FEEDBACK-BASED CONTROLLER

(75) Inventors: Vikash, Bangalore (IN); Kamal Chandwani, Ahmedabad (IN); Rahul Sahu, Kasganj-Kanshiram-Nagar (IN)

(73) Assignee: LSI CORPORATION, Milpitas, CA (US)

( * ) Notice: Subject to any disclaimer, the term of this patent is extended or adjusted under 35 U.S.C. 154(b) by 515 days.

(21) Appl. No.: 13/482,197

(22) Filed: May 29, 2012

(65) Prior Publication Data

US 2013/0322190 A1   Dec. 5, 2013

(51) Int. Cl.
| | |
|---|---|
| G11C 7/00 | (2006.01) |
| G11C 16/04 | (2006.01) |
| G11C 7/22 | (2006.01) |
| G11C 11/24 | (2006.01) |
| G11C 29/50 | (2006.01) |
| G11C 11/41 | (2006.01) |

(52) U.S. Cl.
CPC .............. *G11C 7/227* (2013.01); *G11C 11/24* (2013.01); *G11C 11/41* (2013.01); *G11C 29/50012* (2013.01)

(58) Field of Classification Search
CPC ........ G11C 7/22; G11C 7/12; G11C 11/4094; G11C 7/065; G11C 8/18; G11C 15/04; G11C 16/28; G11C 11/4074; G11C 11/4087; G11C 11/15; G11C 11/22; G11C 8/06; G11C 8/16; G11C 11/16; G11C 7/062; G11C 7/106; G11C 8/08; G11C 8/10
USPC .......... 365/191, 189.03, 189.15, 189.16, 365/189.19, 189.07, 189.09, 210.1, 210.14, 365/200

See application file for complete search history.

(56) References Cited

U.S. PATENT DOCUMENTS

| | | | |
|---|---|---|---|
| 6,201,757 B1 | 3/2001 | Ward et al. | |
| 6,392,957 B1 | 5/2002 | Shubat et al. | |
| 6,483,754 B1 | 11/2002 | Agrawal | |
| 6,643,204 B1 * | 11/2003 | Agrawal | 365/210.1 |
| 6,870,777 B2 | 3/2005 | Maki | |
| 7,440,312 B2 | 10/2008 | Hollis et al. | |
| 2008/0080297 A1 * | 4/2008 | Starnes | 365/233.1 |
| 2008/0205164 A1 * | 8/2008 | Pyeon | 365/185.29 |
| 2013/0308398 A1 * | 11/2013 | Sharad et al. | 365/189.16 |
| 2014/0071783 A1 * | 3/2014 | Sahu et al. | 365/230.08 |

OTHER PUBLICATIONS

T. Ohsawa et al., "Design of a 128-Mb SOI DRAM Using the Floating Body Cell (FBC)," IEEE Journal of Sold-State Circuits, Jan. 2006, pp. 135-145, vol. 41, No. 1.

* cited by examiner

*Primary Examiner* — Hien Nguyen
(74) *Attorney, Agent, or Firm* — Sheridan Ross P.C.

(57) ABSTRACT

A memory device includes a memory array comprising a plurality of memory cells, and control circuitry coupled to the memory array. The control circuitry comprises at least one dummy memory cell, a feedback-based controller having inputs coupled to respective internal nodes of the dummy memory cell, and write signal generation circuitry coupled to the feedback-based controller and configured to provide one or more write signals for controlling writing of data to portions of the memory array. The feedback-based controller generates a reset signal for application to a reset input of the write signal generation circuitry at least in part as a function of a logic level transition delay of a selected one of the first and second internal nodes of the dummy memory cell.

20 Claims, 5 Drawing Sheets

MEMORY DEVICE HAVING CONTROL CIRCUITRY FOR WRITE TRACKING USING FEEDBACK-BASED CONTROLLER

BACKGROUND

A semiconductor memory device typically includes an array of memory cells arranged in rows and columns, with each memory cell configured to store a data bit. The memory cells within a given row of the array are coupled to a common wordline, while the memory cells within a given column of the array are coupled to a common bitline. Thus, the array includes a memory cell at each point where a wordline intersects with a bitline.

In a semiconductor memory device of the type described above, data may be written to or read from the memory cells of the array using a memory cycle that is divided into an active phase and a precharge phase, with the active phase being used to read or write one or more memory cells of the array and the precharge phase being used to precharge the bitlines to a precharge voltage in preparation for the next cycle. Reading a given memory cell generally comprises transferring data stored within that cell to its corresponding bitline, and writing a given memory cell generally comprises transferring data into that cell from its corresponding bitline.

For a given read or write operation, the corresponding memory cycle is more particularly referred to as a read cycle or a write cycle, respectively. In certain types of memory devices, such as static random access memories (SRAMs), the read and write cycle times are not equal. The read access time is typically longer than the write access time, while the write precharge time is longer than the read precharge time.

As is well known to those skilled in the art, read and write self-time tracking arrangements may be used in order to establish appropriate signal timing for respective read and write operations. Such self-time tracking functionality is often designed to control the read and write signal timing over expected process, voltage and temperature (PVT) variations. This is particularly important for high-speed operations having read and write cycle frequencies in the gigahertz (GHz) range.

A conventional self-time tracking arrangement of this type utilizes a dummy row of memory cells and a dummy column of memory cells, associated with a dummy wordline and a dummy bitline, respectively, with those memory cells being configured in substantially the same manner as the actual memory cells of the memory array. A dummy wordline driver generates a dummy wordline signal for application to the dummy wordline with substantially the same timing as an actual wordline signal applied to an actual wordline of the memory array. The dummy wordline and dummy bitline are also known as a self-time wordline (STWL) and a self-time bitline (STBL), respectively.

The signal delay of the dummy wordline due to its resistor-capacitor (RC) time constant is designed to match the corresponding RC signal delay of the actual wordline of the memory array. Also, the wordline loading impact of the dummy column is designed to match the wordline loading impact of an actual bitline of the memory array.

In order to permit independent control of the read and write cycle times, self-time tracking circuitry may be separated into two paths, one for read and another for write. This approach is also called dual mode self-time (DMST).

Conventional self-time tracking arrangements of the type described above can suffer from a number of drawbacks. For example, in one such arrangement, the write cycle time of the actual memory cells is tracked by writing a data bit at one binary logic level to a dummy memory cell in the first half of a given write cycle and then writing a data bit of the opposite logic level to the dummy memory cell in the second half of the write cycle. This generally leads to a write cycle time that is approximately twice the write access time. However, since the write cycle time is the combination of the write access time and the precharge time, and the precharge time is typically less than the write access time, the write cycle time in this arrangement is higher than it should be, which unduly limits the performance of the memory device. Also, this arrangement can fail to accurately track wordline and bitline load, and actual memory cell configuration during write.

SUMMARY

Illustrative embodiments of the present invention provide a memory device incorporating write tracking functionality implemented using a feedback-based controller. A given such embodiment can more accurately track the true write cycle time and thereby improve the performance and power consumption of the memory device.

In one embodiment, a memory device includes a memory array comprising a plurality of memory cells, and control circuitry coupled to the memory array. The control circuitry comprises at least one dummy memory cell, a feedback-based controller having inputs coupled to respective internal nodes of the dummy memory cell, and write signal generation circuitry coupled to the feedback-based controller and configured to provide one or more write signals for controlling writing of data to portions of the memory array. The feedback-based controller generates a reset signal for application to a reset input of the write signal generation circuitry at least in part as a function of a logic level transition delay of a selected one of the first and second internal nodes of the dummy memory cell.

By way of example, the feedback-based controller may be configured to perform only a single write operation to the dummy memory cell within a given write cycle of the memory array and to monitor logic level transition delays associated with the single write operation for the respective first and second internal nodes of the dummy memory cell.

More particularly, in one or more embodiments the feedback-based controller is configured to determine a worst-case transition delay of logic level transition delays of the respective first and second internal nodes of the dummy memory cell in each of a plurality of write cycles of the memory array and to select for use in generating the reset signal for a given one of the write cycles the determined worst-case transition delay.

In such an arrangement, the feedback-based controller may be configured to write data bits of respective alternating logic levels to the dummy memory cell in respective alternating write cycles of the memory array.

The dummy memory cell in a given embodiment may comprise an initial memory cell of each of a dummy column of memory cells and a dummy row of memory cells of the memory device. The initial dummy memory cell is coupled to a dummy bitline that is routed only partially through the column of dummy memory cells and then returned to the initial dummy memory cell. Similarly, the initial dummy memory cell is coupled to a dummy wordline that is routed only partially through the row of dummy memory cells and then returned to the initial dummy memory cell. As a more specific example, the dummy bitline and dummy wordline may be routed exactly halfway through their respective dummy column and dummy row before being returned to the initial dummy memory cell.

One or more of the illustrative embodiments can provide a memory device that exhibits shorter write memory cycles and lower power consumption, as well as improved overall operating performance, relative to conventional devices.

A memory device in accordance with embodiments of the invention may be implemented, for example, as a stand-alone memory device, such as a packaged integrated circuit, or as an embedded memory in a microprocessor or other processing device.

DETAILED DESCRIPTION

Embodiments of the invention will be illustrated herein in conjunction with exemplary semiconductor memory devices and associated control circuitry with write tracking functionality. It should be understood, however, that embodiments of the invention are more generally applicable to any semiconductor memory device in which improvements in write performance are desired, and may be implemented using circuitry other than that specifically shown and described in conjunction with the illustrative embodiments.

Figure 1:
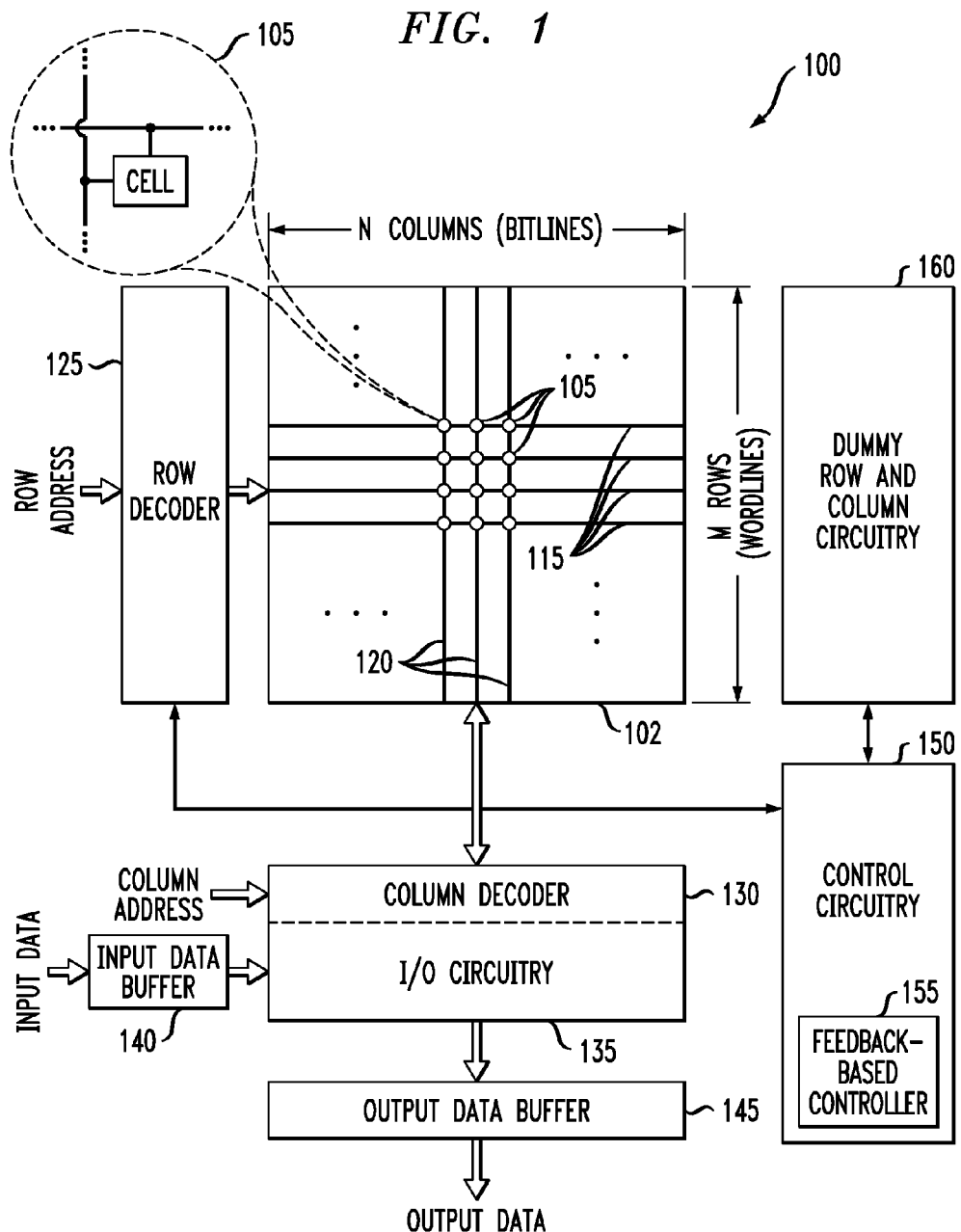
FIG. 1 shows a semiconductor memory device comprising a memory array having a plurality of memory cells and incorporating write tracking functionality implemented using a feedback-based controller in an illustrative embodiment of the invention.

FIG. 1 shows a simplified diagram of a memory device 100 in accordance with an illustrative embodiment of the invention. The memory device 100 comprises a memory array 102. The memory array 102 comprises a plurality of memory cells 105 each configured to store a single bit of data. Such memory cells are also referred to herein as "bitcells." Each cell 105 is coupled to a corresponding row or wordline 115 and column or bitline 120. The memory array therefore includes a memory cell at each point where a wordline intersects with a bitline. The memory cells of the memory array are illustratively arranged in N columns and M rows. The values selected for N and M in a given implementation will generally depend upon on the data storage requirements of the application in which the memory device is utilized. In some embodiments, one of N and M may have value 1, resulting in an array comprising a single column or a single row of memory cells.

Particular ones of the memory cells 105 of the memory array 102 can be activated for writing data thereto or reading data therefrom by application of appropriate row and column addresses to respective row decoder 125 and column decoder 130. Other elements of the memory device 100 include input/output (I/O) circuitry 135, an input data buffer 140 and an output data buffer 145. The I/O circuitry 135 in the present embodiment is assumed by way of example to comprise sensing circuitry, such as differential sense amplifiers coupled to respective columns of the memory array 102. The operation of these and other memory device elements, such as row decoder 125, column decoder 130, and buffers 140 and 145, is well understood in the art and will not be described in detail herein.

Although memory array 102 is identified in FIG. 1 as comprising the cells 105 and their associated wordlines and bitlines 115 and 120, the term "memory array" as used herein is intended to be more broadly construed, and may encompass one or more associated elements such as the row and column decoders 125 and 130, the I/O circuitry 135, or the input and output data buffers 140 and 145, or portions thereof.

Also, the wordlines 115 and bitlines 120, although shown as respective single lines in FIG. 1, may each comprise a corresponding pair of differential lines. By way of example, differential wordlines herein may be denoted as WL and WLB and differential bitlines herein may be denoted as BL and BLB. Also, separate read and write wordlines or bitlines may be used, and a given such read or write wordline or bitline may comprise a corresponding pair of differential lines.

The memory device 100 in one or more of the illustrative embodiments may be assumed to comprise a static random access memory (SRAM) device. However, as indicated previously, the disclosed control circuitry for write tracking using a feedback-based controller can be adapted in a straightforward manner for use with other types of memory devices, including, for example, dynamic random access memory (DRAM), electrically erasable programmable ROM (EEPROM), magnetic RAM (MRAM), ferroelectric RAM (FRAM), phase-change RAM (PC-RAM), etc. Also, other types of memory cell configurations may be used. For example, the memory cells 105 in the memory array 102 could be multi-level cells each configured to store more than one bit of data. Embodiments of the invention are therefore not limited in terms of the particular storage or access mechanism utilized in the memory device.

The present embodiment of memory device 100 is configured to avoid one or more of the drawbacks of conventional practice through the use of control circuitry 150 that includes a feedback-based controller 155. The control circuitry 150 is coupled to dummy row and column circuitry 160 that is associated with the memory array 102, but may be at least partially incorporated into the memory array in other embodiments. The control circuitry also includes write signal generation circuitry, not expressly shown in FIG. 1, that is coupled to the feedback-based controller 155 and configured to provide one or more write signals for controlling writing of data to portions of the memory array 102.

As will be described in greater detail below in conjunction with FIGS. 2 through 4, the feedback-based controller 155 has inputs coupled to respective internal nodes of a given dummy memory cell in the dummy row and column circuitry 160, and is configured to generate a reset signal for application to a reset input of the write signal generation circuitry at least in part as a function of a logic level transition delay of a selected one of the first and second internal nodes of the dummy memory cell.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing embodiments of the invention.

Figure 2:
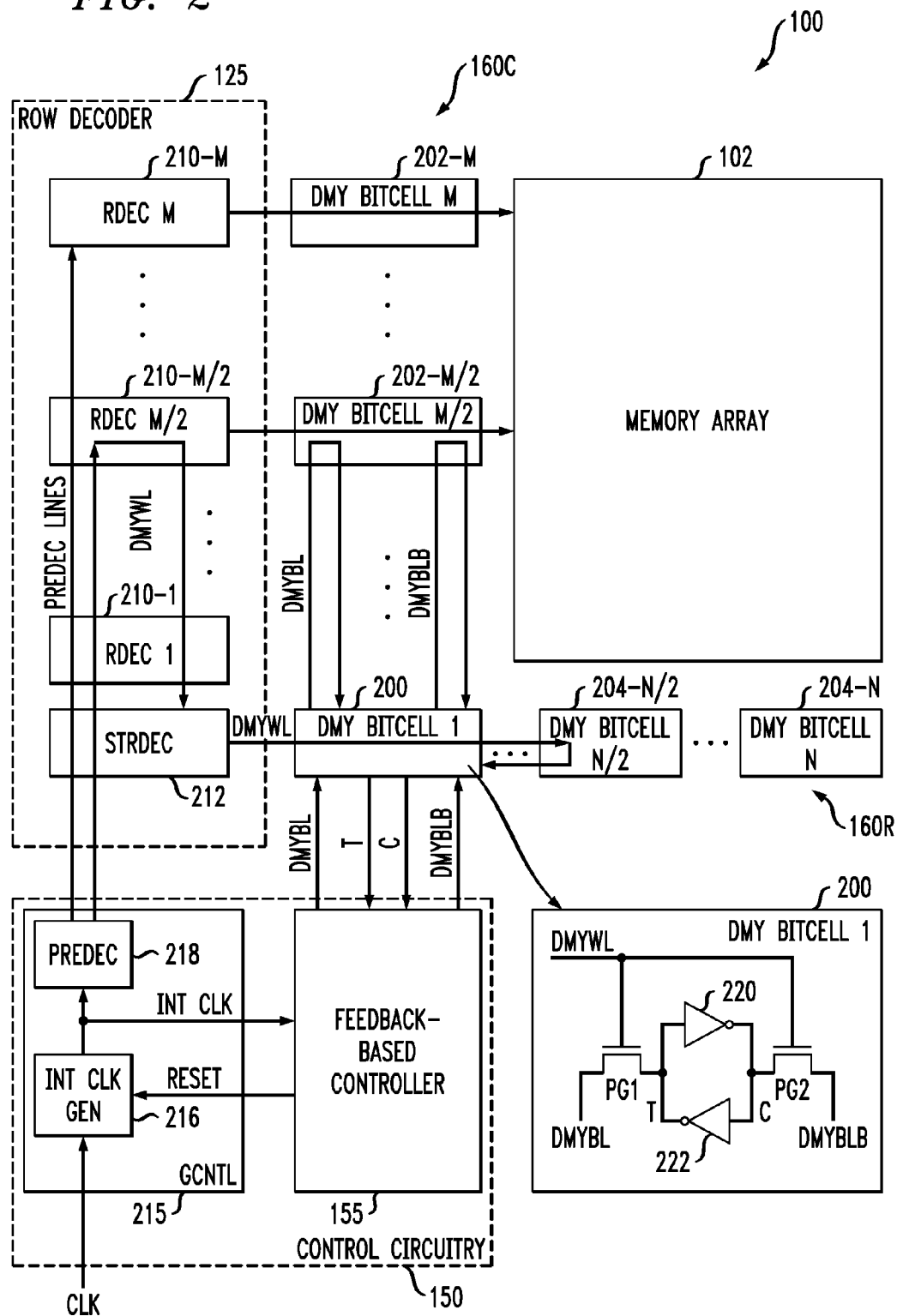
FIG. 2 shows a more detailed view of a portion of the FIG. 1 memory device.

Referring now to FIG. 2, a more detailed view of the FIG. 1 memory device 100 is shown. In this embodiment, the dummy row and column circuitry 160 more particularly comprises a dummy row 160R and a dummy column 160C. The dummy column 160C is coupled between the row decoder 125 and the memory array 102. An initial dummy memory cell 200 is an initial dummy memory cell of both the dummy row 160R and the dummy column 160C, with the remaining M-1 dummy memory cells of the dummy column 160C being denoted as memory cells 202, and the remaining N-1 dummy memory cells of the dummy row 160R being denoted as memory cells 204. The dummy memory cell located halfway between the first and last dummy memory cells of the dummy column 160C is more particularly denoted as dummy memory cell 202-M/2. Similarly, the dummy memory cell located halfway between the first and last dummy memory cells of the dummy row 160R is more particularly denoted as dummy memory cell 204-N/2.

The row decoder 125 comprises M row decoder elements 210-1 through 210-M, also denoted as RDEC 1 through RDEC M, respectively. Each of the row decoder elements 210-1 through 210-M drives a corresponding one of the M wordlines 115 that passes through one of the dummy memory cells of the dummy column 160C and into the memory array 102. The row decoder 125 further comprises a self-time row decoder element 212, also denoted as STRDEC. The self-time row decoder element 212 drives a dummy wordline DMYWL that is routed only partially through the row 160R of dummy memory cells and then returned to the initial dummy memory cell 200. More particularly, the dummy wordline DMYWL in the present embodiment is routed halfway through the row 160R, and therefore is returned to the initial dummy memory cell 200 from the dummy memory cell 204-N/2. Other types of partial routing of the dummy wordline through the dummy row 160R may be used in other embodiments.

The wordline signal on dummy wordline DMYWL is generated from the internal clock signal INT_CLK using predecoder 218 and STRDEC element 212 in a manner similar to the generation of actual wordline signals applied to the memory array 102. The dummy wordline DMYWL is routed only halfway through the dummy row 160R and returned to the initial dummy memory cell 200 in order to mimic the RC signal delay associated with an actual row of the memory array.

The feedback-based controller 155 is configured to write data bits of respective alternating logic levels to the dummy memory cell 200 in respective alternating write cycles of the memory array 102. The feedback-based controller 155 is coupled to the dummy memory cell 200 via a dummy bitline DMYBL and its complement DMYBLB. These dummy bitlines are each routed only partially through the column 160C of dummy memory cells and then returned to the initial dummy memory cell 200. More particularly, the dummy bitline DMYBL and its complement DMYBLB in the present embodiment are each routed halfway through the column 160C, and therefore are returned to the initial dummy memory cell 200 from the dummy memory cell 202-M2. The dummy bitlines DMYBL and DMYBLB are each routed only halfway through the dummy column 160C and returned to the initial dummy memory cell 200 in order to mimic the RC signal delay associated with an actual column of the memory array. Other types of partial routing of the dummy bitline pair through the dummy column 160C may be used in other embodiments.

The feedback-based controller 155 writes data to the dummy memory cell 200 via the dummy bitline pair DMYBL and DMYBLB. It has inputs coupled to respective first and second internal nodes of the dummy memory cell 200. These first and second internal nodes are denoted T and C in the figure, for true and complementary, respectively.

The control circuitry 150 in the present embodiment comprises write signal generation circuitry 215, also denoted as a global control (GCNTL) block. The write signal generation circuitry 215 comprises an internal clock generator 216 configured to generate an internal clock signal denoted INT_CLK, and a predecoder 218. The predecoder 218 has an input adapted to receive the internal clock signal from the clock generator 216. Outputs of the predecoder 218 include predecoder lines that are applied to the RDEC and STRDEC elements of the row decoder 125, and the dummy wordline DMYWL that was previously described.

The predecoder 218 and STRDEC element 212 may be viewed as collectively comprising one possible example of what is more generally referred to as "decoder circuitry." Such decoder circuitry is configured to generate a dummy wordline signal for application to the dummy wordline coupled to the dummy memory cell 200. Other portions of the row decoder 125 may also be considered part of the decoder circuitry as that term is broadly used herein.

The term "write signal generation circuitry" is also intended to be broadly construed, and may in other embodiments comprise additional portions of the memory device 100, such as the STRDEC element 212 as well as other portions of the row decoder 125.

As shown in the inset portion of the figure, the dummy memory cell 200 comprises a pair of cross-coupled inverters 220 and 222, with the input of inverter 220 coupled to the output of inverter 222 at internal node T, and the input of inverter 222 coupled to the output of inverter 220 at internal node C. The dummy memory cell 200 further comprises first and second NMOS pass gate transistors PG1 and PG2, with gate terminals of the pass gate transistors coupled to the dummy wordline DMYWL. Pass gate transistor PG1 has its drain and source terminals coupled between internal node T and the dummy bitline DMYBL. Similarly, pass gate transistor PG2 has its drain and source terminals coupled between internal node C and the dummy bitline DMYBLB.

The dummy memory cell 200 is configured in substantially the same manner as the actual memory cells 105 of the memory array 102, such that the write time in the dummy memory cell 200 closely tracks that of the actual memory cells 105. The other dummy memory cells 202 and 204 of the dummy column 160C and dummy row 160R are also configured in this manner. However, the initial dummy memory cell 200 of column 160C and row 160R is used for write tracking as it is the dummy memory cell in closest proximity to the feedback-based control 155 in the present embodiment, and therefore additional delays in generating a reset signal pulse are avoided.

The feedback-based controller 155 in the present embodiment is configured to determine a worst-case transition delay of logic level transition delays of the respective first and second internal nodes T and C of the dummy memory cell 200 in each of multiple write cycles of the memory array 102. Moreover, it selects the determined worst-case transition delay for use in generating a reset signal denoted RESET for application to a reset input of the clock generator 216 in the corresponding write cycle.

In implementing these functions, the feedback-based controller 155 performs only a single write operation to the dummy memory cell 200 within a given write cycle of the memory array and monitors the logic level transition delays associated with the single write operation for the respective T and C nodes of the dummy memory cell 200. As noted above, data bits of respective alternating logic levels are written to the dummy memory cell 200 in respective alternating write cycles of the memory array 102, and the T and C nodes may be used in an alternating manner in generating the RESET signal, which is operative to reset the INT_CLK signal to a logic low level.

This can avoid the problems associated with the conventional write tracking arrangements in which the write cycle time of the actual memory cells is tracked by writing a data bit at one binary logic level to a dummy memory cell in the first half of a given write cycle and then writing a data bit of the opposite logic level to the dummy memory cell in the second half of the write cycle.

Thus, in the present embodiment, the need to restore a particular data bit logic level in the dummy memory cell at the end of each write cycle is avoided, and yet the worst case transition delay can be determined, resulting in improved tracking of the write behavior of the actual memory cells 105 of memory array 102.

The internal clock signal generated by the clock generator 216 is applied to respective clock inputs of the predecoder 218 and the feedback-based controller 155. As noted above, the feedback-based controller 155 provides the RESET signal back to the reset input of the clock generator 216.

Figure 3:
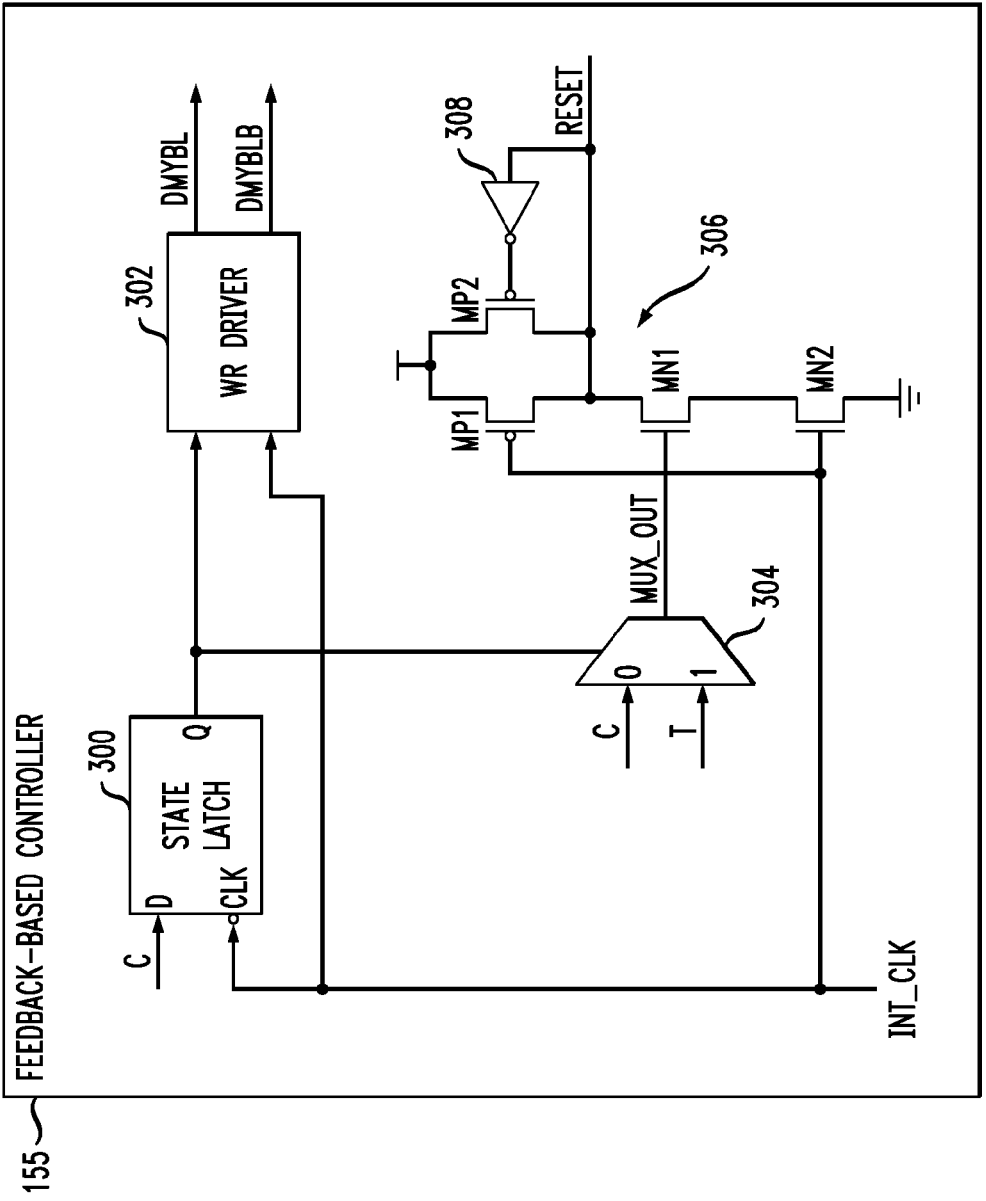
FIG. 3 shows one possible embodiment of the feedback-based controller of the FIG. 1 memory device.

One possible embodiment of the feedback-based controller 155 is shown in FIG. 3. In this embodiment, the feedback-based controller comprises a state latch 300, a write driver 302, a multiplexer 304, and reset signal generation circuitry 306.

The state latch 300 has a data input (D) coupled to a particular one of the internal nodes of the dummy memory cell 200, in this case the internal node C, and an active low clock input CLK that receives the internal clock signal INT_CLK provided by the clock generator 216. A data output (Q) of the state latch 300 is coupled to a first input of the write driver 302 and also serves as the select line for the multiplexer 304. A second input of the write driver 302 receives the internal clock signal INT_CLK, and the outputs of the write driver 302 are the differential lines DMYBL and DMYBLB of the dummy bitline pair.

The multiplexer 304 has inputs coupled to the respective internal nodes T and C of the dummy memory cell 200. A particular one of these inputs is selected for propagation to the multiplexer output MUX_OUT responsive to the logic level of the Q output of the state latch 300. The multiplexer 304 generally selects a particular one of the first and second internal nodes T and C having a worst-case transition delay in a given memory cycle of the memory array responsive to the Q output of the state latch 300.

The reset signal generation circuitry 306 receives the MUX_OUT output from multiplexer 304, as well as the internal clock INT_CLK, and provides at its output the RESET signal that is applied to the reset input of the clock generator 216.

The reset signal generation circuitry 306 in the present embodiment more particularly comprises first and second PMOS devices MP1 and MP2 having their source terminals coupled together and to an upper supply voltage and their drain terminals coupled together and to the reset output. The circuitry 306 further comprises first and second NMOS devices MN1 and MN2, and an inverter 308 having an input coupled to the reset output and an output coupled to a gate terminal of MP2. MP1 and MN2 have their respective gate terminals coupled to the INT_CLK input. MN1 has its drain terminal coupled to the drain terminals of MP1 and MP2, its source terminal coupled to a drain terminal of MN2, and its gate terminal coupled to the MUX_OUT output of the multiplexer 304. MN2 has its drain terminal coupled to the source terminal of MN1 and its source terminal coupled to a lower supply voltage, illustratively ground potential in this embodiment.

The operation of the feedback-based controller 155 of FIG. 3 will now be described in greater detail with reference to the timing diagram of FIG. 4, which shows the FIG. 3 signals CLK, INT_CLK, Q, DMYBL, DMYBLB, T, C, MUX_OUT and RESET over multiple write cycles.

The tracking of a write operation in this embodiment may be viewed as including two sequential sub-operations. The first sub-operation involves writing to the dummy memory cell 200, and the second sub-operation involves generating RESET signal pulse using the internal nodes T and C of the dummy memory cell 200 in a manner that captures the worst-case data transition time.

The write to the dummy memory cell 200 is performed as follows. When a positive edge of CLK arrives, it triggers the dummy wordline DMYWL in a manner that mimics the delay associated with an actual wordline. In parallel, the write driver 302 pulls down one of the two dummy bitlines DMYBL and DMYBLB depending on the logic level of the data bit stored in the state latch 300. Before arrival of a positive edge of INT_CLK, the state latch 300 contains a data bit that is complementary to the data bit stored in the dummy memory cell 200. Thus, if the internal node T of the dummy memory cell 200 is at a logic "0" level then the state latch 300 stores a data bit at a logic "1" level, and vice versa.

The data bit stored in the state latch 300 controls which bitline of the two dummy bitlines DMYBL and DMYBLB should be pulled down by the write driver 302. For example, if internal node T in the dummy memory cell 200 is at a logic "0" level, then the state latch 300 stores a data bit at a logic "1" level and DMYBLB is pulled down to ground by the write driver 302 such that a data bit of opposite logic level can be written to the dummy memory cell 200. Similarly, if internal node T in the dummy memory cell 200 is at a logic "1" level, then the state latch 300 stores a data bit at a logic "0" level and DMYBL is pulled down to ground by the write driver 302 such that a data bit of opposite logic level can be written to the dummy memory cell 200. Therefore, the write driver 302 controlled by the state latch 300 writes data bits of respective alternating logic levels to the dummy memory cell 200 in respective alternating write cycles, resulting in toggling of both the internal nodes T and C of the dummy memory cell so as to mimic actual write operations.

Figure 4:
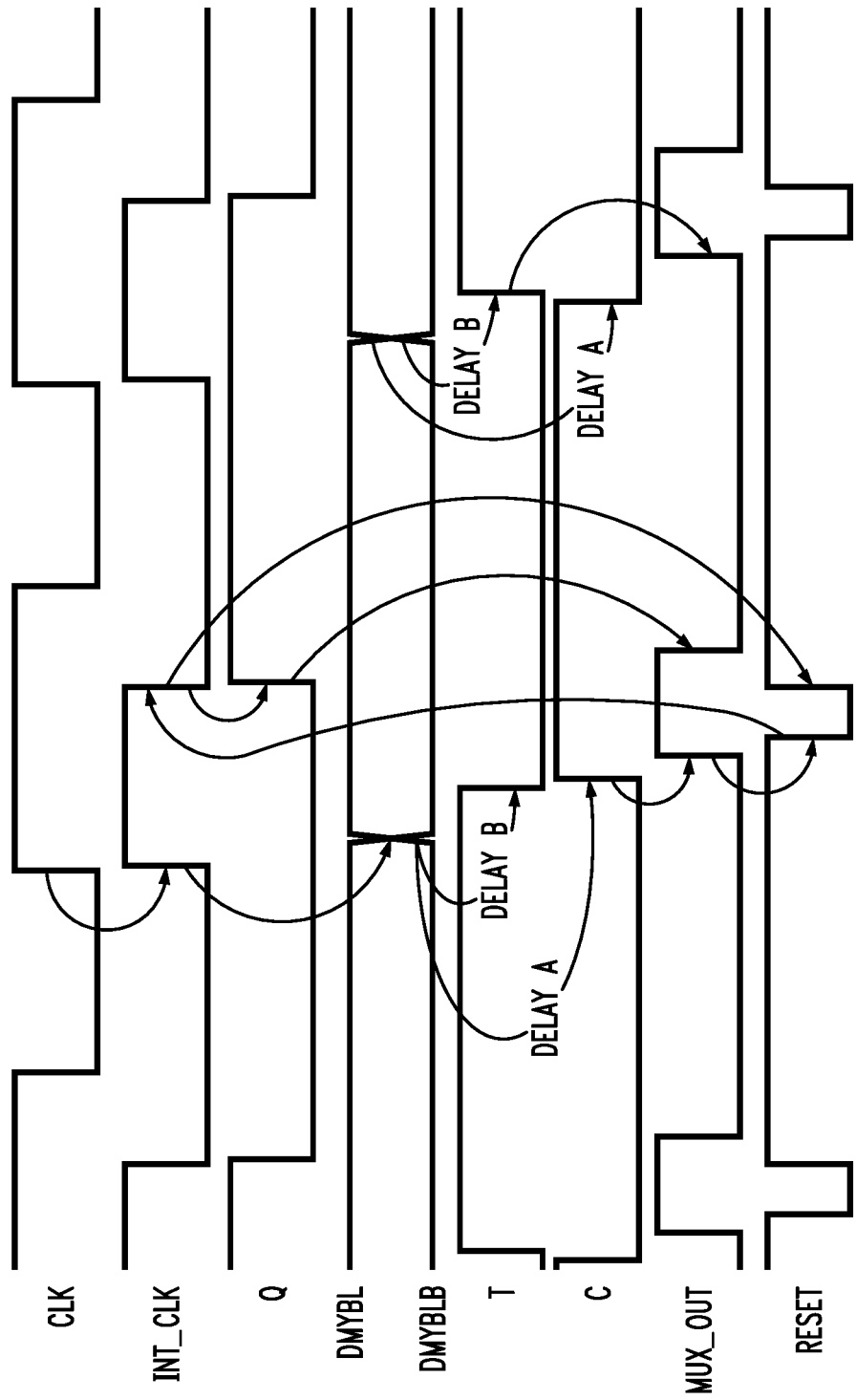
FIG. 4 is a timing diagram illustrating the operation of the write tracking functionality implemented using the feedback-based controller of FIG. 3.

The generation of the RESET signal pulse involves selecting the worst-case delay between delays A and B shown in the FIG. 4 timing diagram, where delay A is the delay between the falling edge of DMYBL and the corresponding transition at internal node C, and delay B is the delay between the falling edge of DMYBL and the corresponding transition at internal node T. The selection of the worst-case delay depends on the data stored in the state latch 300. For example, if the state latch 300 stores a data bit at a logic "1" level, then the dummy bitline DMYBLB is pulled down by write driver 302. Since in this case the dummy bitline DMYBLB is being pulled down to write into the dummy memory cell 200, the node closer to DMYBLB, which is node C, will transition earlier than node T. Similarly, if the state latch 300 stores a data bit at a logic "0" level, then the dummy bitline DMYBL is pulled down by write driver 302. Since in this case the dummy bitline DMYBL is being pulled down to write into the dummy memory cell 200, the node closer to DMYBL, which is node T, will transition earlier than node C.

The feedback-based controller 155 is therefore configured to capture the worst-case delay between the two delays A and B, by utilizing the output of the state latch 300 to control the 2:1 multiplexer 304 to select either C or T for use in generating a RESET signal pulse. In conjunction with a given such pulse, the RESET signal goes low to reset the actual wordline and thereby complete the WRITE operation. The RESET signal going low triggers INT_CLK to go low as seen in the timing diagram, and before the beginning of the next cycle, the RESET signal returns to its default high logic level. When INT_CLK goes low, transistors MP1 and MN1 of the reset signal generation circuitry 306 turn on and off, respectively, causing RESET to return to the high logic level. By writing alternating data logic levels to the dummy memory cell 200 in alternating write cycles and selecting for each write cycle the worst-case transition delay between the internal nodes T and C, the feedback-based controller 155 generates a RESET signal that accurately mimics the write behavior of the actual memory cells 105 of memory array 102 over PVT variations.

The control circuitry 150 comprising feedback-based controller 155 therefore provides significantly improved tracking of actual write time of the memory cells 105 of the memory array 102. This reduces write cycle time and power consumption, and improves the overall operating performance of the memory device 100.

It is to be appreciated that the particular control circuitry shown in the embodiments of FIGS. 2 through 4 is presented by way of illustration only, and a wide variety of other types of control circuitry may be utilized in other embodiments of the present invention. For example, in one or more of these other embodiments, the conductivity types of at least a subset of the PMOS and NMOS transistors may be reversed, and other suitable modifications may be made to the control circuitry and associated signaling levels, as would be appreciated by one skilled in the art. Also, other types of write signal generation circuitry, feedback-based controllers and other memory device components may be used in implementing other embodiments.

Embodiments of the present invention are particularly well suited for use in high-speed SRAMs and DRAMs, as well as other types of memories that demand high write speeds, such as content-addressable memories (CAMs) and processor register files.

A given memory device configured in accordance with an embodiment of the present invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise, for example, an embedded memory implemented within a microprocessor, digital signal processor (DSP), application-specific integrated circuit (ASIC), field-programmable gate array (FPGA) or other type of processor or integrated circuit device.

Figure 5:
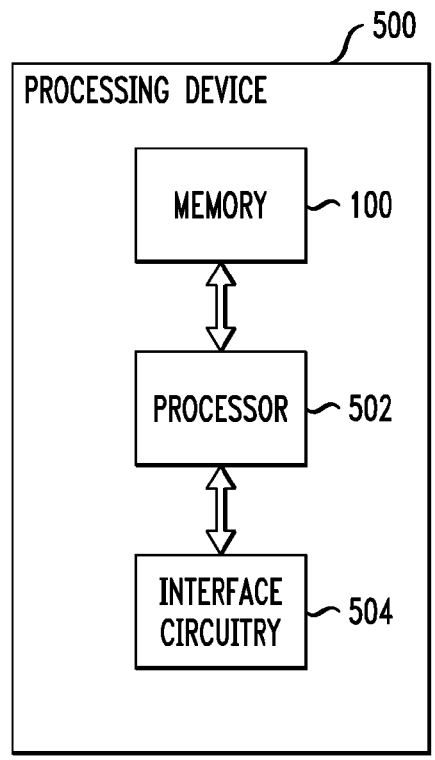
FIG. 5 is a block diagram of a processing device which incorporates the FIG. 1 memory device.

FIG. 5 shows an embodiment of a processing device 500 which incorporates the memory device 100 of FIG. 1. In this embodiment, the memory device 100 is coupled to a processor 502. The processing device further includes interface circuitry 504 coupled to the processor 502. The processing device 500 may comprise, for example, a computer, a server or a portable communication device such as a mobile telephone. The interface circuitry 504 may comprise one or more transceivers for allowing the device 500 to communicate over a network.

Figure 6:
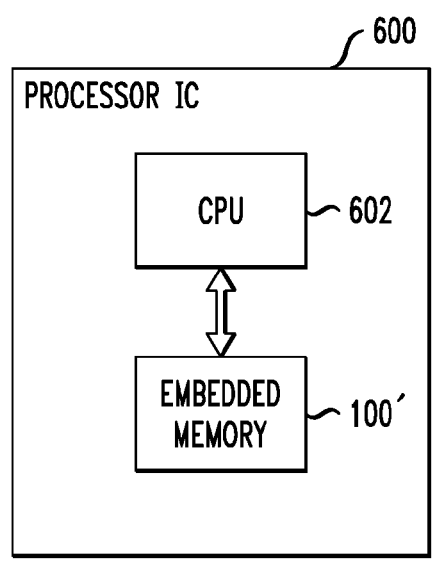
FIG. 6 is a block diagram of a processor integrated circuit which incorporates the FIG. 1 memory device as an embedded memory.

Alternatively, processing device 500 may comprise a microprocessor, DSP or ASIC, with processor 502 corresponding to a central processing unit (CPU) and memory device 100 providing at least a portion of an embedded memory of the microprocessor, DSP or ASIC. FIG. 6 shows an example of an arrangement of this type, with processor integrated circuit 600 incorporating the memory device of FIG. 1 as an embedded memory 100'. The embedded memory 100' in this embodiment is coupled to a CPU 602. The embedded memory may comprise, for example, a high-speed register file. Numerous alternative embedded memory embodiments are possible.

As indicated above, embodiments of the invention may be implemented in the form of integrated circuits. In fabricating such integrated circuits, identical die are typically formed in a repeated pattern on a surface of a semiconductor wafer. Each die includes a memory device with control circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the above-described embodiments of the invention are intended to be illustrative only. For example, other embodiments can use different types and arrangements of memory arrays, memory cell circuitry, control circuitry, feedback-based controllers, write signal generation circuitry, transistor conductivity types, control signals, and other elements for implementing the described write tracking functionality. These and numerous other alternative embodiments within the scope of the following claims will be apparent to those skilled in the art.

What is claimed is:

1. A memory device comprising:
    a memory array comprising a plurality of memory cells; and
    control circuitry coupled to the memory array;
    the control circuitry comprising:
    at least one dummy memory cell;
    a feedback-based controller having inputs coupled to respective internal nodes of the dummy memory cell; and
    write signal generation circuitry coupled to the feedback-based controller and configured to provide one or more write signals for controlling writing of data to portions of the memory array;
    wherein the feedback-based controller generates a reset signal for application to a reset input of the write signal generation circuitry at least in part as a function of a logic level transition delay of a selected one of the first and second internal nodes of the dummy memory cell.

2. The memory device of claim 1 wherein the feedback-based controller is configured to determine a worst-case transition delay of logic level transition delays of the respective first and second internal nodes of the dummy memory cell in each of a plurality of write cycles of the memory array and to select for use in generating the reset signal for a given one of the write cycles the determined worst-case transition delay.

3. The memory device of claim 1 wherein the feedback-based controller is configured to perform only a single write operation to the dummy memory cell within a given write cycle of the memory array and to monitor logic level transition delays associated with the single write operation for the respective first and second internal nodes of the dummy memory cell.

4. The memory device of claim 1 wherein the feedback-based controller is configured to write data bits of respective alternating logic levels to the dummy memory cell in respective alternating write cycles of the memory array.

5. The memory device of claim 1 wherein the dummy memory cell comprises an initial dummy memory cell of a column of dummy memory cells of the control circuitry.

6. The memory device of claim 5 wherein the initial dummy memory cell is coupled to a dummy bitline that is routed only partially through the column of dummy memory cells and then returned to the initial dummy memory cell.

7. The memory device of claim 1 wherein the dummy memory cell comprises an initial dummy memory cell of a row of dummy memory cells of the control circuitry.

8. The memory device of claim 7 wherein the initial dummy memory cell is coupled to a dummy wordline that is routed only partially through the row of dummy memory cells and then returned to the initial dummy memory cell.

9. The memory device of claim 1 wherein the write signal generation circuitry comprises:
    a clock generator configured to generate an internal clock signal; and
    decoder circuitry having an input adapted to receive the internal clock signal from the clock generator and being configured to generate a dummy wordline signal for application to a dummy wordline coupled to the dummy memory cell.

10. The memory device of claim 9 wherein the feedback-based controller receives the internal clock signal from the clock generator and wherein the reset input of the write signal generation circuitry that receives the reset signal from the feedback-based controller comprises a reset input of the clock generator.

11. The memory device of claim 1 wherein the feedback-based controller comprises:
    a state latch having an input coupled to a particular one of the internal nodes of the dummy memory cell;
    a dummy bitline driver having an input coupled to an output of the state latch and an output providing a dummy bitline signal for application to a dummy bitline coupled to the dummy memory cell;
    a multiplexer having first and second inputs coupled to the respective first and second internal nodes of the dummy memory cell and a select line coupled to the output of the state latch; and
    reset signal generation circuitry having an input coupled to an output of the multiplexer and a reset output providing the reset signal;
    wherein the multiplexer selects a particular one of the first and second internal nodes having a worst-case transition delay in a given memory cycle of the memory array responsive to a select signal at the output of the state latch.

12. The memory device of claim 11 wherein the state latch is clocked by a clock signal of the write signal generation circuitry and wherein said clock signal is also applied to a clock input of the dummy bitline driver and a clock input of the reset signal generation circuitry.

13. The memory device of claim 12 wherein the reset signal generation circuitry comprises:
    first and second PMOS devices having their source terminals coupled together and to an upper supply voltage and their drain terminals coupled together and to the reset output;
    first and second NMOS devices; and
    an inverter having an input coupled to the reset output and an output coupled to a gate terminal of the second PMOS device;
    the first PMOS device and the second NMOS device having their respective gate terminals coupled to the clock input of the reset signal generation circuitry;
    the first NMOS device having its drain terminal coupled to the drain terminals of the first and second PMOS devices, its source terminal coupled to a drain terminal of the second NMOS device, and its gate terminal coupled to the output of the multiplexer;
    the second NMOS device having its drain terminal coupled to the source terminal of the first NMOS device and its source terminal coupled to a lower supply voltage.

14. An integrated circuit comprising the memory device of claim 1.

15. A processing device comprising the memory device of claim 1.

16. A method comprising:
    generating one or more write signals for controlling writing of data to portions of a memory array comprising a plurality of memory cells; and
    generating a reset signal for resetting a given one of the write signals at least in part as a function of a logic level transition delay of a selected one of first and second internal nodes of a dummy memory cell.

17. The method of claim 16 wherein the step of generating a reset signal comprises:
    determining a worst-case transition delay of logic level transition delays of the respective first and second internal nodes of the dummy memory cell in each of a plurality of write cycles of the memory array; and
    selecting for use in generating the reset signal for a given one of the write cycles the determined worst-case transition delay.

18. The method of claim 16 wherein the step of generating a reset signal comprises:
    performing only a single write operation to the dummy memory cell within a given write cycle of the memory array; and
    monitoring logic level transition delays associated with the single write operation for the respective first and second internal nodes of the dummy memory cell.

19. The method of claim 16 wherein the step of generating a reset signal comprises writing data bits of alternating logic level to the dummy memory cell in respective alternating memory cycles of the memory array.

20. An apparatus comprising:
    a feedback-based controller having inputs adapted for coupling to respective internal nodes of a dummy memory cell of a memory array; and
    write signal generation circuitry coupled to the feedback-based controller and configured to provide one or more write signals for controlling writing of data to portions of the memory array;
    wherein the feedback-based controller generates a reset signal for application to a reset input of the write signal generation circuitry at least in part as a function of a logic level transition delay of a selected one of the first and second internal nodes of the dummy memory cell.

* * * * *